(12) United States Patent
Ramaraju et al.

(10) Patent No.: US 6,928,005 B2
(45) Date of Patent: Aug. 9, 2005

(54) DOMINO COMPARATOR CAPABLE FOR USE IN A MEMORY ARRAY

(75) Inventors: Ravindraraj Ramaraju, Round Rock, TX (US); George P. Hoekstra, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 112 days.

(21) Appl. No.: 10/703,657

(22) Filed: Nov. 5, 2003

(65) Prior Publication Data

US 2005/0105324 A1 May 19, 2005

(51) Int. Cl.[7] .................................................. G11C 7/00
(52) U.S. Cl. ................. 365/189.07; 365/49; 365/189.08
(58) Field of Search .............................. 365/189.07, 49, 365/189.08, 190

(56) References Cited

U.S. PATENT DOCUMENTS 4,740,971 A * 4/1988 Tam et al. .................. 714/711
5,754,463 A   5/1998 Henstrom et al.
5,862,085 A * 1/1999 De Lange ............... 365/189.07
6,859,376 B2 * 2/2005 Kanazawa et al. ............ 365/49

* cited by examiner

Primary Examiner—Tan T. Nguyen
(74) Attorney, Agent, or Firm—Joanna G. Chiu

(57) ABSTRACT

A memory including a NOR logic gate having an input coupled to a bitline (BL) and an input to receive the complement of the data value (DATABAR). The memory also including a NOR logic gate having an input coupled to the bitline bar (BLBAR) and an input to receive the data value (DATA). A combine stage is also included having an input coupled to an output of the NOR logic gate, an input coupled to an output of the NOR logic gate, and an output to provide a miss indicator (MISS). The miss indicator (MISS) indicates when a value on the bitline (BL) does not match the data value (DATA). The memory also comprising a plurality of bitcells coupled to the bitline (BL) and bitline bar (BLBAR), where each of the plurality of bitcells is coupled to a corresponding word line.

20 Claims, 5 Drawing Sheets

| $BL_0$ | $DATABAR_0$ | OUTPUT OF NOR GATE 102 | $BLBAR_0$ | $DATA_0$ | OUTPUT OF NOR GATE 104 | MISS |
|---|---|---|---|---|---|---|
| 0 | 0 | 1 | 1 | 1 | 0 | 1 |
| 0 | 1 | 0 | 1 | 0 | 0 | 0 |
| 1 | 0 | 0 | 0 | 1 | 0 | 0 |
| 1 | 1 | 0 | 0 | 0 | 1 | 1 |

DOMINO COMPARATOR CAPABLE FOR USE IN A MEMORY ARRAY

FIELD OF THE INVENTION

The present invention relates to an integrated circuit, and more particularly, to a domino comparator circuit for use in an integrated circuit.

RELATED ART

Comparator circuits are commonly used to compare an incoming signal to the contents of memory. For example, comparator circuits are often used to look up an entry in a tag array by comparing a portion of an address received via an address bus to the tag array. Techniques used to perform such comparisons vary from system to system and many do not contain the ability to perform such comparison logic effectively.

One solution known in the art utilizes true and complementary outputs and compares them to the reference input data. For example, in the prior art shown in FIG. 1, the comparison of a data value and a bitline value is accomplished using a bitwise exclusive-or operation. The XOR circuitry 36 has a clock input connected to the XOR portion of the circuitry causing the XOR operation to be dependent on the clock during the evaluation phase. By requiring a clock enable in XOR circuitry 36 via transistor 22, the speed is decreased in the overall circuit.

Another solution known in the art represented in FIG. 2 utilizes pass gates to perform the exclusive-or operation. Node 59 coupling the pass gates is precharged using precharge circuitry and is held in the corresponding state by half-latch components 64 and 66. The output of the exclusive-or operation is then combined to generate the comparator output. A drawback related to the prior art shown in FIG. 2 is that the precharge components and the half-latch components used in the XOR portion of the circuitry 78 cause a decrease in speed of the comparator. In addition, the pass gate logic circuitry causes unwanted noise to be added to the comparator. Another drawback of the embodiment shown in FIG. 2 is due to the criticality of node 59 having to remain in a fixed state once it has been evaluated to that state. For example, if the node coupling the pass gates is not held low when it should be held low, then the circuitry will perform false comparisons, which is not a desirable attribute of an effective comparator.

Another solution known in the art today utilizes hit logic concepts. Utilizing hit logic concepts requires a carefully planned and timed control signal that is critical for successful compare operations. The timed control clock signal is necessary in order to sample the miss signal after it has been pulled to a certain state. The need for the carefully planned and timed control signal results in increased complexity of the comparator which results in increased chip area. Furthermore, the additional chip area that is necessary to implement the hit logic results in increased cost.

Therefore, a need exists for an improved comparator design that is more robust, less susceptible to noise, and more cost effective.

BRIEF DESCRIPTION OF THE DRAWINGS

The present invention is illustrated by way of example and not limited by the accompanying figures, in which like references indicate similar elements, and in which.

Figure 1:
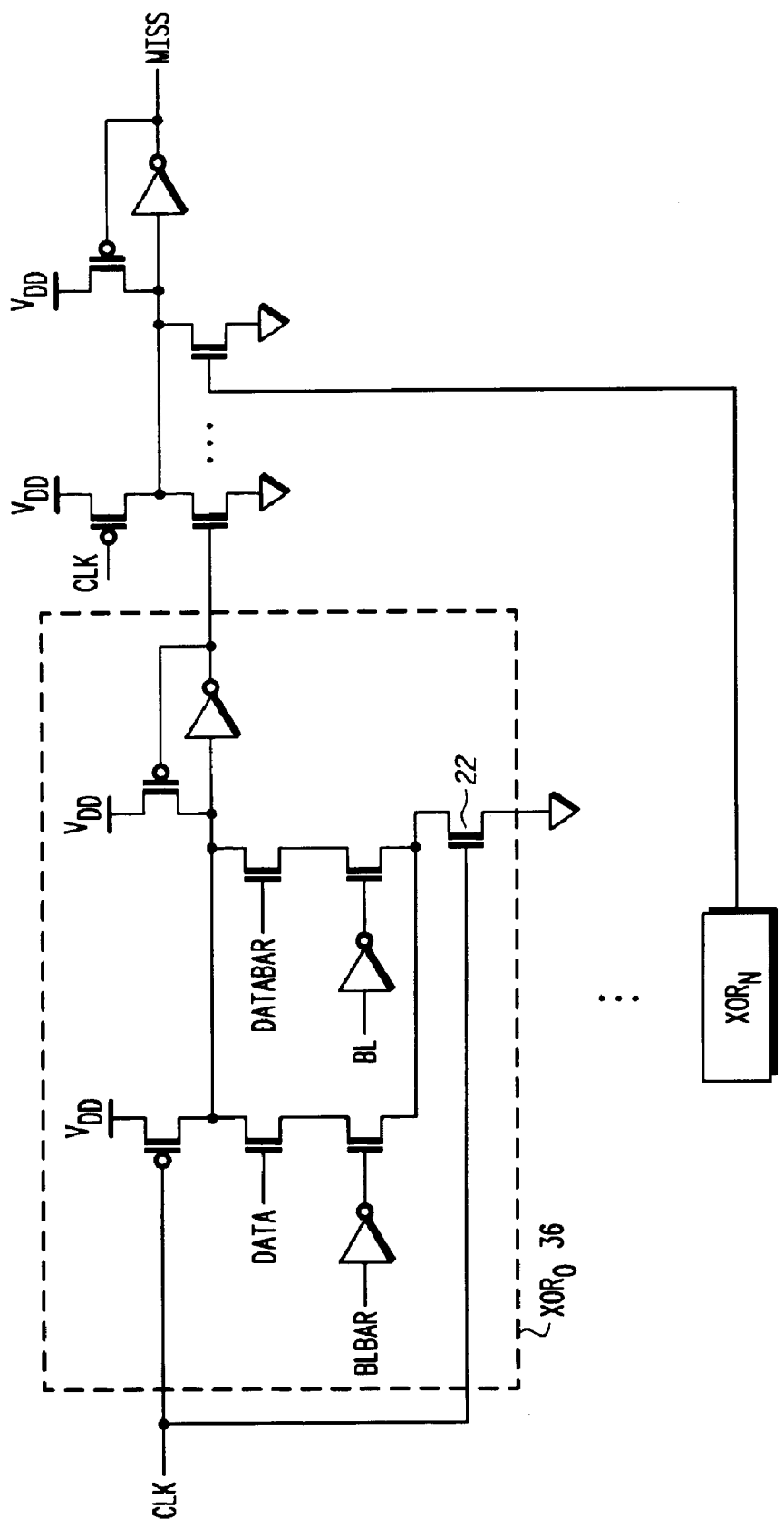
FIG. 1 illustrates, in schematic form, prior art related to a comparator circuit.
Figure 2:
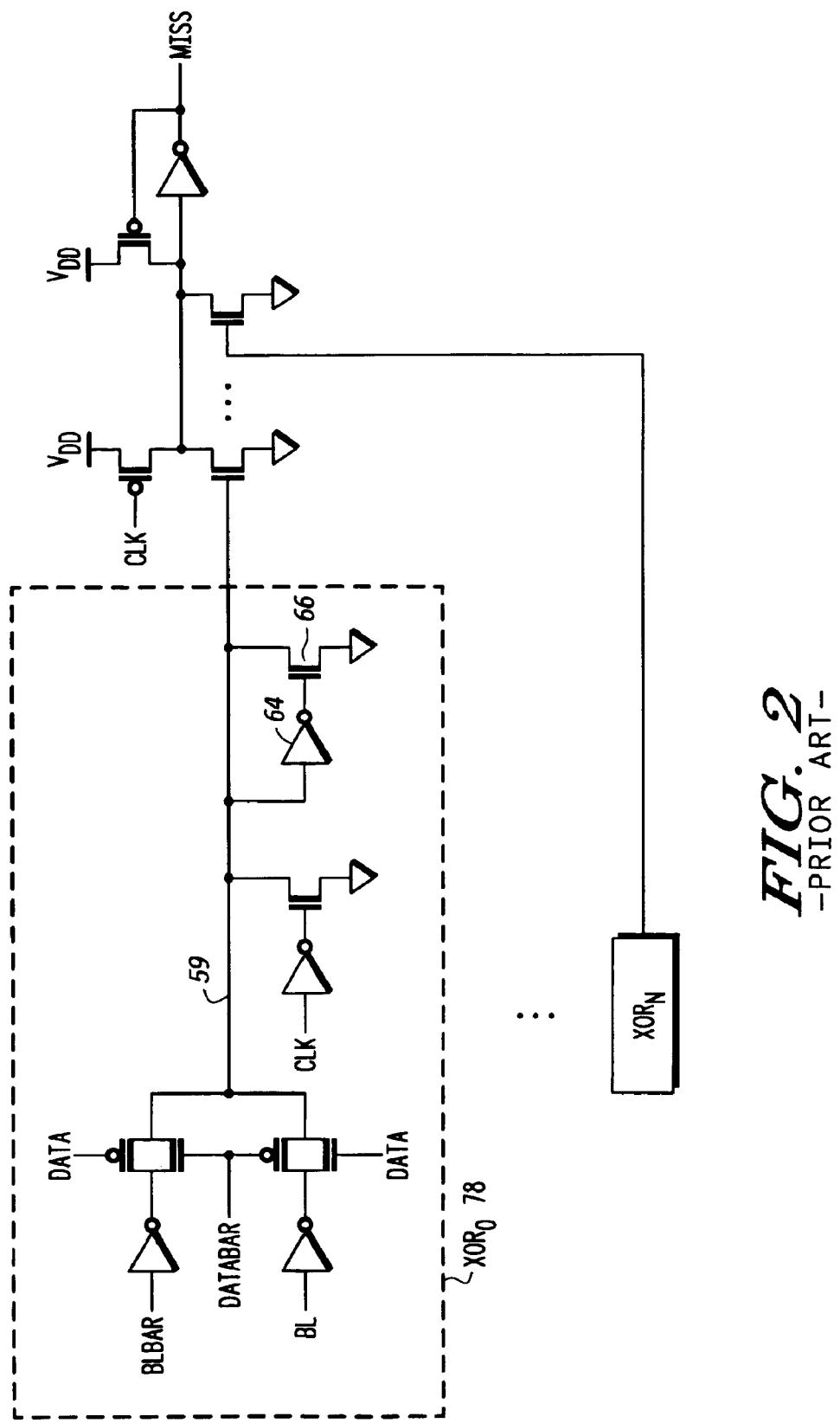
FIG. 2 illustrates, in schematic form, prior art related to a comparator circuit.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

As used herein, the term "bus" is used to refer to a plurality of signals or conductors which may be used to transfer one or more various types of information, such as data, addresses, control, or status. The terms "assert" and "negate" are used when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one. Other than during the precharge phase, as will be described further below, the term "BAR" following a signal name denotes the complement of the signal it is representing. For example, DATABAR refers to the complement of DATA. Furthermore, the bitlines described in the embodiments below are typically stored in a memory array, where the memory array may be any type of memory, such as, for example, a read-only memory (ROM), a random access memory (RAM), static random access memory (SRAM), non-volatile memory (e.g. Flash), etc.

In a memory system it is often necessary to compare a bitline to a data value and determine whether the bitline value matches the data value. This is often the case when an incoming signal must be compared to the contents of a memory cell, such as, for example, when comparing a portion of an address received via an address bus to a bitcell entry in a tag array. Various embodiments of the present invention relate to using column compare circuitry to perform logic operations necessary to perform such comparisons and provide the corresponding results via a miss indicator. In one embodiment, the comparison results are provided independent of the clock signal during an evaluation phase, and, as a result of the comparison, a miss indicator indicates when the bitline value and the data value match. Although many of the embodiments described herein are in reference to comparing a data value to the contents of a memory cell, the embodiments described herein can also be realized anywhere a comparator is utilized.

One embodiment of the present invention relates to a memory including a bitline, a bitline bar, a NOR logic gate having an input coupled to the bitline and an input to receive a complement of a data value, a NOR logic gate having an input coupled to the bitline bar and a second input to receive the data value, and a combine stage. The combine stage has an input coupled to an output of the first NOR logic gate, an input coupled to an output of the second NOR logic gate, and an output to provide a miss indicator. The miss indicator indicates when a value on the bitline does not match the data value.

Another embodiment of the present invention relates to a method for providing a comparison result. A first value, a second value, a complement of the first value, and a complement of the second value are provided to a combinational logic stage of a comparator. During the precharge phase of a clock signal, the first value and the complement of the first value are precharged to a first voltage, wherein the first voltage propagates to an output of the combinational logic stage during the precharge phase. During an evaluation phase of the clock signal, the first and second inputs of the combinational logic stage propagate independent of the clock signal, through the combinational logic stage and a combine stage coupled to the output of the combinational logic stage to provide a comparison result between the first value and the second value.

Another embodiment of the present invention relates to a method for providing a comparison result. A first NOR logic gate is provided having a first input to receive a first value, a second input to receive a complement of a second value, and an output. A second NOR logic gate is provided having a first input to receive a complement of the first value, a second input to receive the second value, and an output. During a precharge phase of a clock signal, the first value and the complement of the first value are precharged to a first voltage, wherein the first voltage propagates to the output of the first and second NOR logic gates during the precharge phase. During an evaluation phase of the clock signal, the first and second inputs of each of the first and second NOR logic gates propagate, independent of the clock signal, through the first and second NOR logic gates and a combine stage coupled to the output of the first and second NOR logic gates to provide a comparison result between the first value and the second value.

Figure 3:
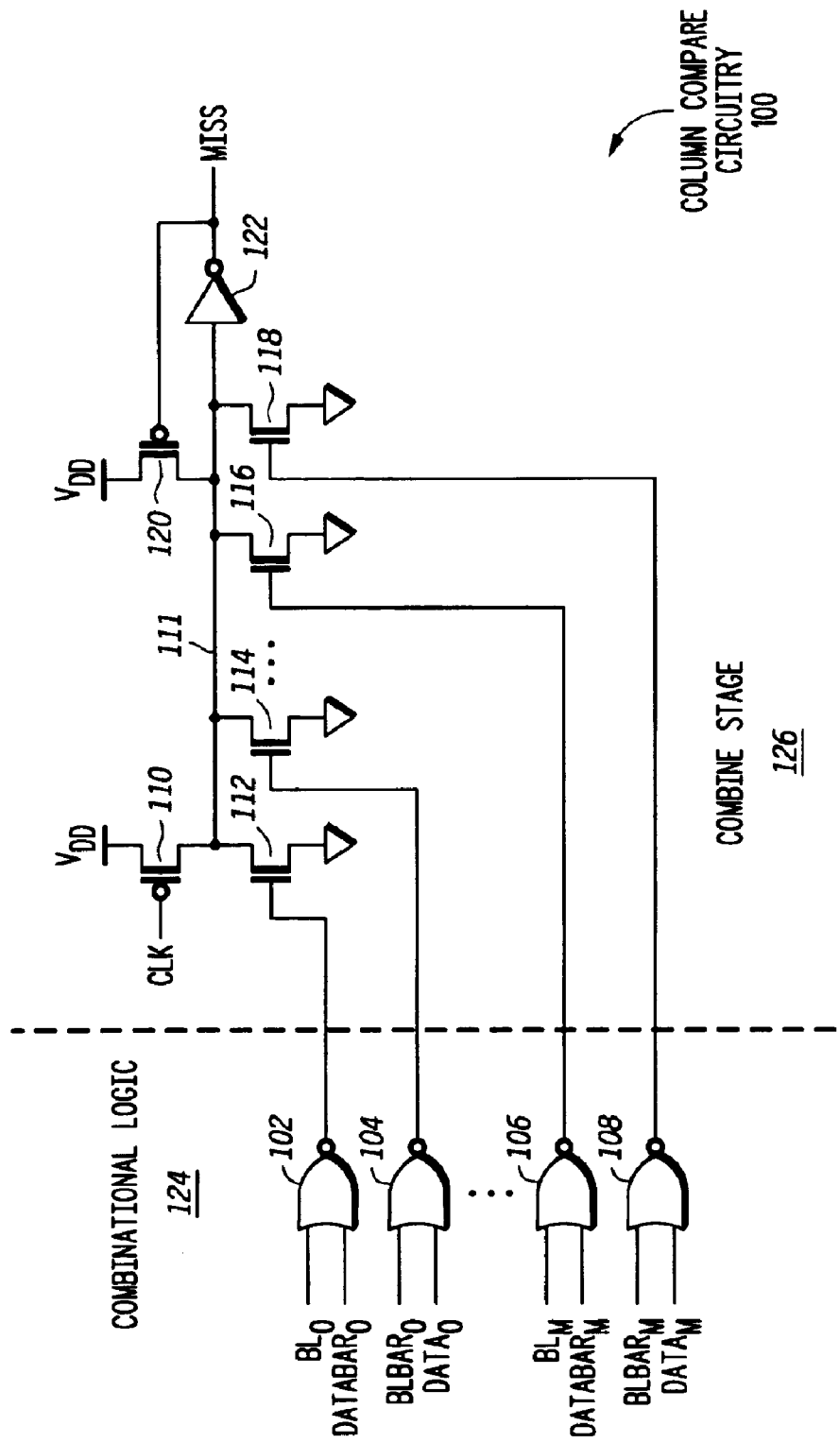
FIG. 3 illustrates, in schematic form, column compare circuitry in accordance with one embodiment of the present invention.

FIG. 3 depicts one embodiment of column compare circuitry 100 which includes combinational logic 124 and combine stage 126. Combinational logic 124 includes NOR gate 102, NOR gate 104, NOR gate 106, and NOR gate 108. Combine stage 126, which is coupled to the output of the NOR gates of combinational logic 124, includes PMOS transistor 110, NMOS transistor 112, NMOS transistor 114, NMOS transistor 116, NMOS transistor 118, PMOS transistor 120, inverter 122, a ground connection, a clock connection, and a voltage source $V_{DD}$.

Each of NMOS transistors 112, 114, 116, 118 and PMOS transistors 110 and 120 have a first current electrode, a second current electrode (e.g., reference terminal), and a first control electrode. The first control electrodes of NMOS transistors 112, 114, 116 and 118 are coupled the outputs of NOR gates 102, 104, 106, and 108, respectively. The first current electrodes of NMOS transistors 112, 114, 116, and 118 and the input of inverter 122 are coupled to the first current electrodes of PMOS transistors 110 and 120 at node 111. The second current electrodes of NMOS transistors 112, 114, 116, and 118 are coupled to ground and the second current electrodes of PMOS transistors 110 and 120 are coupled to a voltage source $V_{DD}$. The first control electrode of PMOS transistor 110 is coupled to a clock source, while the first control electrode of PMOS transistor 120 is coupled to the output of inverter 122, which serves as the output of column compare circuitry 100.

Bitline values, data values, and their corresponding complements are provided as inputs to combinational logic 124. In this case, $BL_0$ and $DATABAR_0$ serve as inputs to NOR gate 102, $BLBAR_0$ and $DATA_0$ serve as inputs to NOR gate 104, $BL_M$ and $DATABAR_M$ serve as inputs to NOR gate 106, and $BLBAR_M$ and $DATA_M$ serve as inputs to NOR gate 108. The outputs of NOR gates 102, 104, 106, and 108 serve as the inputs to the control electrodes of NMOS transistors 112, 114, 116, and 118, respectively.

In one embodiment of FIG. 3, when a plurality of M+1 bitline values need to be compared to a plurality of M+1 data values, column compare circuitry 100 may perform a comparison of the two (M+1)-bit values. In this case, the (M+1)-bit bitline values and their complements are represented by $BL_0$–$BL_M$ and $BLBAR_0$–$BLBAR_M$, which may correspond to a tag value in a memory. The (M+1)-bit data values and their complements are represented by $DATA_0$–$DATA_M$ and $DATABAR_0$–$DATABAR_M$, which may correspond to a received address value. The (M+1)-bit values can therefore be indexed according to the bit number. For example, $BL_0$, $BLBAR_0$, $DATA_0$, and $DATABAR_0$ are used to refer to the $0^{th}$ bit and $BL_M$, $BLBAR_M$, $DATA_M$, and $DATABAR_M$ are used to refer to the $M^{th}$ bit. While the embodiment of FIG. 3 compares two (M+1)-bit values, alternate embodiments may use similar circuitry to compare more than 2 values. Furthermore, M may be any integer value.

Operation of FIG. 3 will be described in reference to a precharge phase and an evaluation phase. As can be seen in reference to FIG. 6 (which will be described in more detail below), the precharge phase corresponds to the low portions of the clock signal (e.g., the input to PMOS transistor 110) and the evaluation phases corresponds to the high portions of the clock. That is, during the precharge phase, the clock is at a logic level 0, and during the evaluation phase, the clock is at a logic level 1. Note that alternate embodiments may define the precharge and evaluation phases differently.

In operation of at least one embodiment of the present invention, during the precharge phase (which is initiated when the clock input to PMOS transistor 110 transitions low), the bitline and bitlinebar values of combinational logic 124 are precharged to a logic level 1. Column compare circuitry 100 uses combinational logic 124, combine stage 126, bitline, and bitline bar values to precharge the miss indicator (MISS) to a logic level 0. At some point during the precharge phase, the data which is to be compared to the bitline value or bitline values (for a plurality of bitlines) is validated and applied as an input to combinational logic 124.

When the clock signal transitions high, the precharge phase is complete and the evaluation phase is initiated. During the evaluation phase, combinational logic 124 uses NOR gates 102, 104, 106, and 108 to logically NOR the bitline, databar, bitlinebar, and data values and provide the results to combine stage 126. Combine stage 126 utilizes transistors 110, 112, 114, 116, 118, 120, inverter 122, and the output of combinational logic 124 to determine whether a match or a mismatch has occurred between the bitline values and data values. Whether a bitline value and a data value match or mismatch is indicated via the output of column compare circuitry 100 by a miss indicator. A miss indicator evaluated to a logic level 0 indicates that a match has occurred and a miss indicator evaluated to a logic level 1 indicates a miss has occurred. Therefore, if any one of bits 0–M results in a miss, at least one of the outputs of NOR gates 102, 104, 106, and 108 will go high causing the corresponding NMOS transistor (one of NMOS transistors 112, 114, 116, and 118) to pull node 111 low, thus resulting in the output MISS to go high, indicating a miss has occurred.

Figures 4, 5:
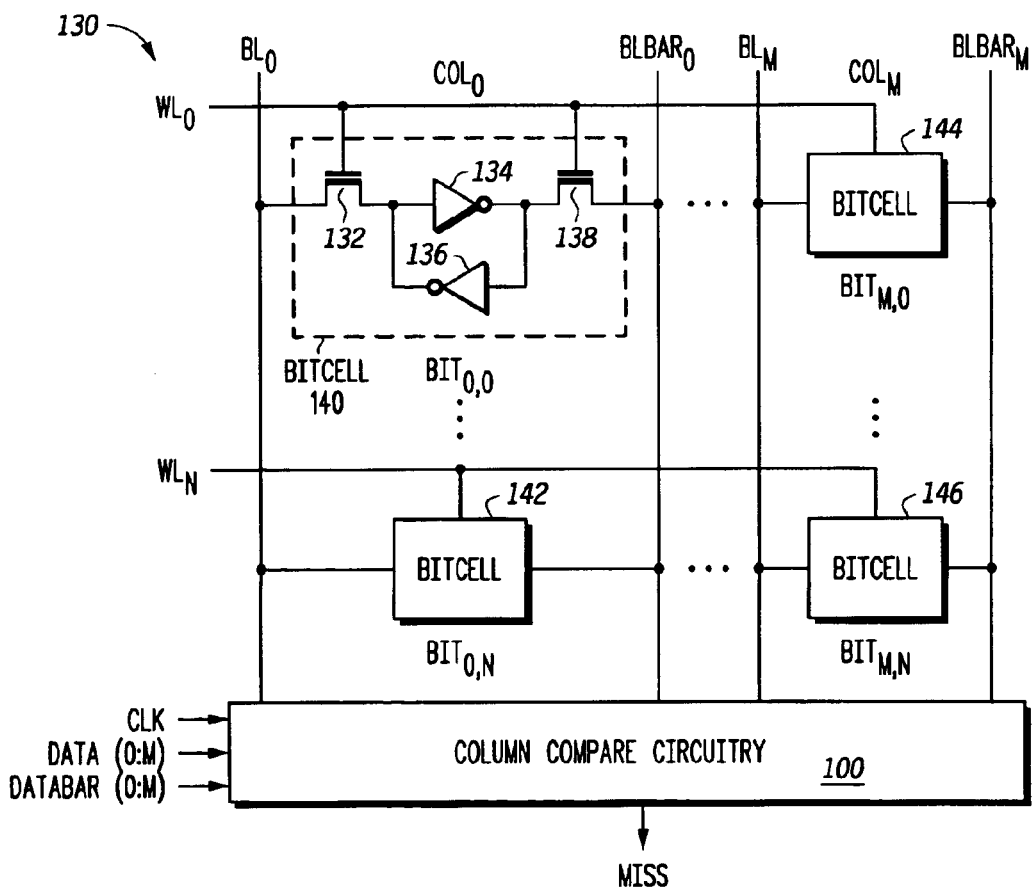
FIG. 4 illustrates, in table form, a truth table for the column compare circuitry of FIG. 3, in accordance with one embodiment of the present invention.
FIG. 5 illustrates, in partial schematic form and partial block diagram form, a memory in accordance with one embodiment of the present invention.

Operation of FIG. 3 will be further described in reference to FIG. 4, where FIG. 4 is an example of the $0^{th}$ bit during the evaluation phase. FIG. 3 shows $BL_0$ and $DATABAR_0$ serving as inputs to NOR gate 102 and $BLBAR_0$ and $DATA_0$ serving as inputs to NOR gate 104. During the precharge phase, as initiated by the clock transitioning low, $BL_0$ and $BLBAR_0$ are precharged to 1. Referring to FIG. 3, for any value of $DATA_0$ and $DATABAR_0$, the OUTPUT OF NOR GATE 102 and the OUTPUT OF NOR GATE 104 are 0 during the precharge phase (due to BL and $BLBAR_0$ being precharged to 1), resulting in transistors 112 and 114 being turned off. During the precharge phase, transistor 110 is turned on as a result of the clock input being at logic level 0 and node 111 is pulled to logic level 1 then inverted to a logic level 0 by inverter 122. The result is a precharge phase MISS value of 0.

During the evaluation phase, when the clock is at a logic level 1, the precharge of $BL_0$ and $BLBAR_0$ is released, causing one of $BL_0$ or $BLBAR_0$ to go to 0. The table of FIG. 4 illustrates the values of the OUTPUT OF NOR GATE 102, OUTPUT OF NOR GATE 104, and MISS based on various values of $BL_0$, $BLBAR_0$ $DATA_0$, and $DATABAR_0$ during the evaluation phase. In the example shown in FIG. 4, $BL_0$ is a 1 ($BLBAR_0$ is 0) and $DATA_0$ can be either a 1 or a 0. Assuming $DATA_0$ is a 1 ($DATABAR_0$ is 0), then the OUTPUT OF NOR GATE 102 is 0 and the OUTPUT OF NOR GATE 104 is 0 (as can be seen in reference to FIG. 4). NMOS transistors 112 and 114 are turned off, and the MISS value retains its previous precharge state of 0 using inverter 122 and PMOS transistor 120 as a mechanism for state retention. The MISS value of 0 during evaluation phase indicates that a match between $BL_0$ and $DATA_0$ has occurred. Similarly, if $BL_0$ is a 0 ($BLBAR_0$ is 1), and $DATA_0$ is a 0 ($DATABAR_0$ is 1), then the OUTPUT OF NOR GATE 102 is 0 and the OUTPUT OF NOR GATE 104 is 0 (as can be seen in reference to FIG. 4) and NMOS transistors 112 and 114 are turned off. A MISS value of 0 is retained at the output of inverter 122, indicating that a match between $BL_0$ and $DATA_0$ has occurred.

During the evaluation phase with reference to FIG. 4, when the $BL_0$ value is a 0 ($BLBAR_0$ is a 1) and the $DATA_0$ value is a 1 ($DATABAR_0$ is 0), then the OUTPUT OF NOR GATE 102 is a 1 (resulting transistor 112 being on) and the OUTPUT OF NOR GATE 104 is a 0 (resulting in transistor 114 being off). Previously precharged node 111 is pulled to a logic level 0 and then inverted by inverter 122 to result in a MISS value of 1, which indicates that a miss (mismatch) has occurred between the $BL_0$ value and $DATA_0$ value. Similarly, when the $BL_0$ value is 1 ($BLBAR_0$ is 0) and $DATA_0$ value is a 0 ($DATABAR_0$ is 1), the OUTPUT OF NOR GATE 102 is 0 and the OUTPUT OF NOR GATE 104 is 1, resulting in transistor 112 being off and transistor 114 being on. Node 111 is pulled to a logic level 0 and then inverted by inverter 122 to a logic level 1, resulting in a MISS value of 1 indicating that a miss has occurred between $BL_0$ and $DATA_0$.

FIG. 4 shows that miss goes high when output of NOR gate 102 or NOR gate 104 goes high. Note that this is one bit of the entire M+1 values, meaning if any output goes high, miss becomes asserted. That is, when a plurality of bitline values ($BL_0$–$BL_M$) are compared to a plurality of data values ($DATA_0$–$DATA_M$), if any one of the data values do not match with their corresponding bitline value, the outputs of the NOR gates corresponding to the mismatched data and bitline values are asserted to a logic level 1. This causes the transistor located at the output of the corresponding NOR gate (one of transistors 112 through 118) to pull node 111 to a logic level 0, which is then inverted by inverter 122 to a logic level 1 indicating that a miss has occurred.

FIG. 5 illustrates a memory 130 including an array of bitcells 140, 142, 144, 146 and column compare circuitry 100 in accordance with one embodiment of the present invention. Bitcell 140 includes NMOS transistors 132 and 138 coupled to inverters 134 and 136 for use as storage devices. Inverters 134 and 136 operate as a latch, such that when bitcell 140 is selected, transistor 132 provides the value at the output of 136 to $BL_0$ and the output of 134 to $BLBAR_0$. The bitcells up to and including bitcells 142, 144, 146, may include the same circuitry as described with reference to bitcell 140. Note that bitcells 140, 142, 144, and 146 may be designed in many ways and operate as known in the art and will not be described in more detail.

Memory 130 and bitcells 140, 142, 144, and 146 can be implemented in a variety of configurations and may include, for example, a TAG array utilized in combination with column compare circuitry 100 to compare a value stored in a bitcell to an incoming data value. Memory 130 includes column compare circuitry 100 coupled to bitcells 140, 142, 144, 146 via bitline and bitlinebar lines. Memory 130 is illustrated as an N×M memory (having N rows and M columns) where N and M can each be any integer value.

Bitcell 140 corresponds to $BIT_{0,0}$, and is therefore coupled to $BL_0$, $BLBAR_0$, and $WL_0$. Bitcell 144 corresponds to $BIT_{M,0}$ and is therefore coupled to $BL_M$, $BLBAR_M$, and $WL_0$. Bitcell 142 corresponds to $BIT_{0,N}$ and is therefore coupled to $BL_0$, $BLBAR_0$, and $WL_N$. Bitcell 146 corresponds to $BIT_{M,N}$ and is therefore coupled to $BL_M$, $BLBAR_M$, and $WL_N$. Bitcells 140 and 144 are coupled to wordline $WL_0$ and bitcells 142 and 146 are coupled to wordline $WL_N$. Therefore, the values of the bitcells coupled to $WL_0$ (including bitcells 140 and 144) are provided as $BL_0$–$BL_M$ and $BLBAR_0$–$BLBAR_M$ when $WL_0$ is asserted, and the values of the bitcells coupled to $WL_N$ (including bitcells 142 and 146) are provided as $BL_0$–$BL_M$ and $BLBAR_0$–$BLBAR_M$ when $WL_N$ is asserted. Therefore, a particular row of 130 is selected by asserting a wordline such that the values of bitcells are indicated by $BL_0$–$BL_M$.

In one embodiment of the present invention, for a comparison of a plurality of bitline values to a plurality of data values, a bus of (M+1) number of DATA and DATABAR bits are compared to the values stored in a tag memory array of (M+1) bits with (N+1) wordlines of data. During normal operation, a row of M+1 bits of a tag array (selected by asserting one of $WL_0$ to $WL_N$, where the selection and assertion of a wordline is performed by control circuitry coupled to memory 130 not shown in FIG. 5, but as known in the art) is compared to DATA 0 to M. Combinational logic 124 receives M+1 bitline values corresponding to the currently asserted wordline and the M+1 data values and performs the NOR logic operations shown in FIG. 3. Depending on whether the values output by NOR gates 102, 104, 106, and 108 corresponding to each comparison of the M+1 bitline values and data values are a 1 or a 0, NMOS transistors of combine stage 126 (e.g., 112, 114, 116, and 118) are either turned on or remain off during the evaluation phase. If any one of transistors 112–118 is turned on, then node 111 is pulled low and a MISS signal indicating a mismatch occurs. If all of transistors 112–118 retain their off state, then the miss indicator retains its precharged low state indicating a match has occurred.

Figure 6:
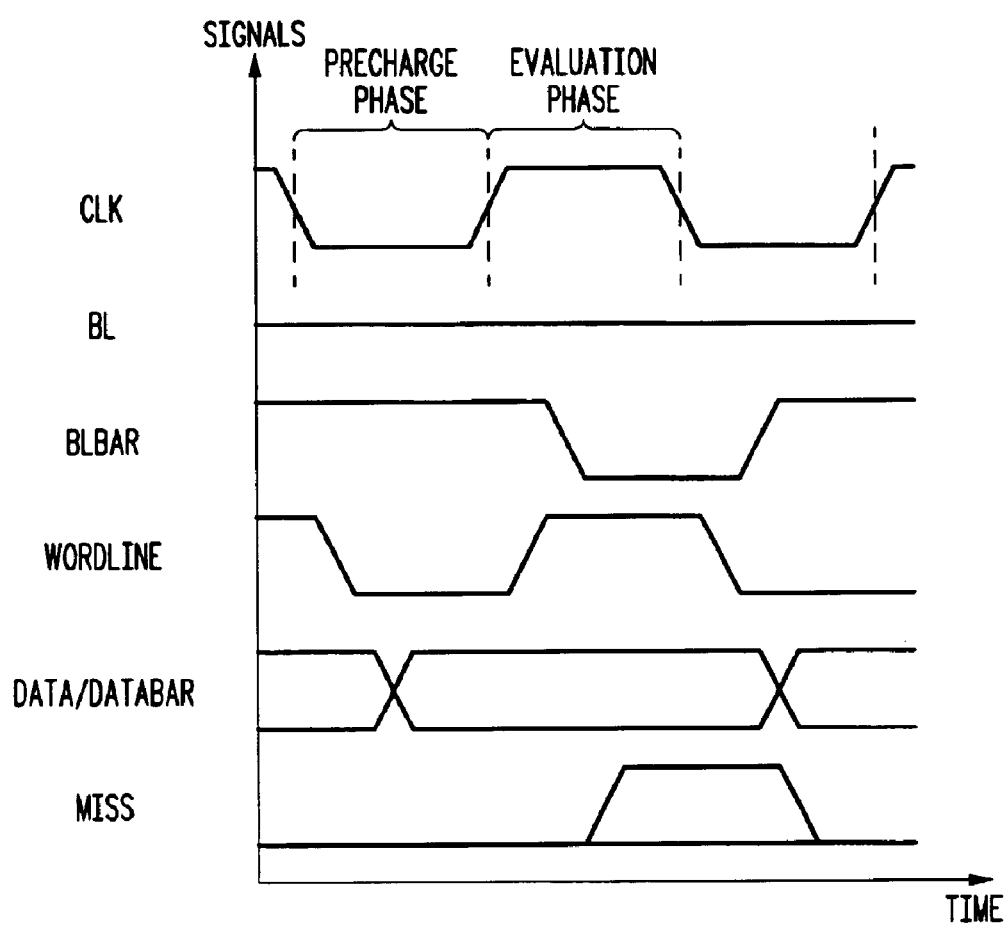
FIG. 6 illustrates the timing signals of the column compare circuitry of FIG. 3 in accordance with one embodiment of the present invention.

FIG. 6 shows timing of signals during the precharge and evaluation phases of column compare circuitry 100. During the precharge phase, the bitline (BL) and complement of the bitline (BLBAR) are precharged to a high value and the wordline is not yet selected. Also, due to the precharging of BL and BLBAR, the miss indicator is 0. At some point during the precharge phase, the data that is used for comparison against the bitline value and its complement (DATA and DATABAR) become valid. During the evaluation phase, the wordline (WL) is selected (indicated in FIG. 6 by the assertion of the wordline). Also, precharging of the bitline is concluded and BL and BLBAR take on values corresponding to the data stored in the bitcell corresponding to the selected WL and depending upon whether the bitline value and the data value match, the miss indicator (MISS) evaluates to either a 1 or a 0.

Therefore, embodiments of the present invention allow for comparing a bitline value to a data value and determining whether the bitline value matches the data value. By turning off PMOS transistor 110 during the evaluation phase of column compare circuitry 100, data can flow through combinational logic 124 to the combine stage 126 independent of the clock. In addition, since pass gate logic circuitry is not utilized in column compare circuitry 100, the undesirable noise caused by unnecessary pass gates is eliminated.

Although the invention has been described with respect to specific conductivity types or polarity of potentials, skilled artisans appreciate that conductivity types and polarities of potentials may be reversed. Also, in the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Furthermore, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A memory, comprising:
   a bitline;
   a bitline bar;
   a first NOR logic gate having a first input coupled to the bitline and a second input to receive a complement of a data value;
   a second NOR logic gate having a first input coupled to the bitline bar and a second input to receive the data value; and
   a combine stage having a first input coupled to an output of the first NOR logic gate and a second input coupled to an output of the second NOR logic gate, and an output to provide a miss indicator, wherein the miss indicator indicates when a value on the bitline does not match the data value.

2. The memory of claim 1, further comprising a plurality of bitcells coupled to the bitline and the bitline bar, each of the plurality of bitcells coupled to a corresponding word line.

3. The memory of claim 2, wherein memory comprises a tag portion, the tag portion comprising the plurality of bitcells.

4. The memory of claim 1, further comprising:
   a second bitline;
   a second bitline bar;
   a third NOR logic gate having a first input coupled to the second bitline and a second input to receive a complement of a second data value; and
   a fourth NOR logic gate having a first input coupled to the second bitline bar and a second input to receive the second data value, wherein the combine stage has a third input coupled to an output of the third NOR logic gate and a fourth input coupled to an output of the fourth NOR logic gate.

5. The memory of claim 1, wherein the combine stage performs a logical OR operation on the outputs of the first and second NOR logic gates to provide the miss indicator.

6. The memory of claim 1, further comprising an input for receiving a clock signal, wherein during a precharge phase of a clock signal, the bitline and bitline bar are precharged to a first voltage.

7. The memory of claim 6, wherein the first voltage corresponds to a logic level one.

8. The memory of claim 6, wherein during an evaluation phase of the clock signal, values at the outputs of the first and second NOR logical gates propagate through the combine stage independent of the clock signal.

9. A method for providing a comparison result, comprising:
   providing a first value, a second value, a complement of the first value, and a complement of the second value to a combinational logic stage of a comparator;
   during a precharge phase of a clock signal, precharging the first value and the complement of the first value to a first voltage, wherein the first voltage propagates to an output of the combinational logic stage during the precharge phase; and
   during an evaluation phase of the clock signal, the first and second inputs of the combinational logic stage propagate, independent of the clock signal, through the combinational logic stage and a combine stage coupled to the output of the combinational logic stage to provide a comparison result between the first value and the second value.

10. The method of claim 9, wherein the first voltage represents a logic level one.

11. The method of claim 9, wherein the first value corresponds to a bitline value of a memory array and the second value corresponds to an input data value.

12. The method of claim 9, wherein the precharge phase corresponds to a low phase of the clock signal and the evaluation phase corresponds to a high phase of the clock signal.

13. The method of claim 9, wherein the combine stage performs an OR function on the output of the combinational logic stage.

14. A method for providing a comparison result, comprising:
   providing a first NOR logic gate having a first input to receive a first value, a second input to receive a complement of a second value, and an output;
   providing a second NOR logic gate having a first input to receive a complement of the first value, a second input to receive the second value, and an output;
   during a precharge phase of a clock signal, precharging the first value and the complement of the first value to a first voltage, wherein the first voltage propagates to the output of the first and second NOR logic gates during the precharge phase; and during an evaluation phase of the clock signal, the first and second inputs of each of the first and second NOR logic gates propagate, independent of the clock signal, through the first and second NOR logic gates and a combine stage coupled to the output of the first and second NOR logic gates to provide a comparison result between the first value and the second value.

15. The method of claim 14, wherein the first voltage represents a logic level one.

16. The method of claim 14, wherein the first input of the first NOR logic gate is coupled to a bitline of a memory and the first input of the second NOR logic gate is coupled to a bitline bar of the memory.

17. The method of claim 16, wherein the bitline and bitline bar of the memory correspond to a tag portion of the memory.

18. The method of claim 17, wherein the memory comprises a static random access memory (SRAM) array.

19. The method of claim 14, wherein the precharge phase corresponds to a low phase of the clock signal and the evaluation phase corresponds to a high phase of the clock signal.

20. The method of claim 14, wherein the combine stage performs a logical OR function on the outputs of the first and second NOR logic gates to provide the comparison result.

* * * * *